(12) United States Patent
Moran et al.

(10) Patent No.: US 9,060,434 B2
(45) Date of Patent: Jun. 16, 2015

(54) ELECTRONIC DISPLAYS AND METAL MICROPATTERNED SUBSTRATES HAVING A GRAPHIC

(71) Applicant: 3M INNOVATIVE PROPERTIES COMPANY, St. Paul, MN (US)

(72) Inventors: Cristin E. Moran, St. Paul, MN (US); Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 160 days.

(21) Appl. No.: 14/018,475

(22) Filed: Sep. 5, 2013

(65) Prior Publication Data

US 2014/0003005 A1 Jan. 2, 2014

Related U.S. Application Data

(62) Division of application No. 13/321,185, filed as application No. PCT/US2010/039103 on Jun. 18, 2010, now Pat. No. 8,553,400.

(60) Provisional application No. 61/221,888, filed on Jun. 30, 2009.

(51) Int. Cl.
*G06F 1/16* (2006.01)
*H05K 1/02* (2006.01)
*G09F 9/30* (2006.01)
*G09F 13/02* (2006.01)
*G09F 13/16* (2006.01)

(52) U.S. Cl.
CPC .............. *H05K 1/0296* (2013.01); *G09F 9/30* (2013.01); *G09F 13/02* (2013.01); *G09F 13/16* (2013.01)

(58) Field of Classification Search
CPC ........................................................ G06F 9/30
See application file for complete search history.

(56) References Cited

U.S. PATENT DOCUMENTS

| 7,609,451 | B1 | 10/2009 | Scarbrough |
| 7,733,646 | B2* | 6/2010 | Hisatsune ..................... 361/690 |
| 8,081,430 | B2 | 12/2011 | Weber et al. |
| 2003/0161093 | A1 | 8/2003 | Lam |
| 2008/0095985 | A1 | 4/2008 | Frey |
| 2009/0218310 | A1 | 9/2009 | Zu |

(Continued)

FOREIGN PATENT DOCUMENTS

| FR | 2850482 | 7/2004 |
| JP | 10-326152 | 12/1998 |

(Continued)

OTHER PUBLICATIONS

International Search Report PCT/US2010/039103; Oct. 1, 2010 4 pages.

*Primary Examiner* — Anthony Q Edwards
(74) *Attorney, Agent, or Firm* — Adrian L. Pishko

(57) ABSTRACT

Electronic displays and metal micropatterned substrates are described comprising a graphic defined by a contrasting area adjacent the graphic. In one embodiment, the graphic is visible when the display is viewed with reflected light and the graphic is substantially less visible or invisible when viewed with backlighting transmitted through the metal micropatterned substrate. The graphic and contrasting area have a total metal micropattern density that differs by no greater than about 5% and more preferably by no greater than 2%.

24 Claims, 5 Drawing Sheets

(56) References Cited

U.S. PATENT DOCUMENTS

| | | |
|---|---|---|
| 2009/0219257 A1 | 9/2009 | Frey |
| 2009/0219258 A1 | 9/2009 | Geaghan |
| 2010/0026664 A1 | 2/2010 | Geaghan |
| 2010/0156840 A1 | 6/2010 | Frey |
| 2010/0271767 A1 | 10/2010 | Weber et al. |
| 2010/0277805 A1 | 11/2010 | Schilling et al. |
| 2011/0226733 A1 | 9/2011 | Zu |
| 2011/0262723 A1 | 10/2011 | Lavosky |
| 2011/0286156 A1 | 11/2011 | Beecher et al. |

FOREIGN PATENT DOCUMENTS

| | | |
|---|---|---|
| JP | 2006-344163 | 12/2006 |
| JP | 2008-124299 | 5/2008 |
| JP | 2008-129708 | 6/2008 |
| WO | WO 2004/077388 | 9/2004 |
| WO | WO 2010/099132 | 9/2010 |
| WO | WO 2010/151471 | 12/2010 |

* cited by examiner

ELECTRONIC DISPLAYS AND METAL MICROPATTERNED SUBSTRATES HAVING A GRAPHIC

CROSS-REFERENCE TO RELATED APPLICATIONS

This application is a divisional application of application Ser. No. 13/321,185, filed Jun. 18, 2010, now allowed, which is a national stage filing under 35 U.S.C. 371 of PCT/US2010/039103, filed Jun. 18, 2010, which claims priority to Provisional Application No. 61/221,888, filed Jun. 30, 2009, the disclosure of which is incorporated by reference in its/their entirety herein.

SUMMARY

In one embodiment, an electronic display is described comprising a transparent substrate having a metal micropattern wherein at least a portion of the metal micropattern is contiguous and in electrical connection with circuitry of the electronic display. The metal micropattern comprises at least one graphic defined by a contrasting area adjacent the graphic. The metal micropattern of the graphic, the metal micropattern of the contrasting area, or a combination thereof comprise non-contiguous micropattern features that are not in electrical connection with the circuitry of the electronic display.

In other embodiments, (e.g. optionally transparent) substrates are described comprising a metal micropattern having at least one graphic defined by a contrasting area adjacent the graphic. In one embodiment, the graphic, the contrasting area, or a combination thereof comprises non-contiguous micropattern features that differ in density, dimension, shape, orientation, or a combination thereof. In another embodiment, the graphic comprises (e.g. contiguous or non-contiguous) micropattern features having a different orientation than the contrasting area. In another embodiment, the graphic, the contrasting area, or a combination thereof comprise (e.g. contiguous or non-contiguous) parallel linear micropattern features.

In another embodiment, a display is described comprising a metal micropatterned transparent substrate wherein the metal micropattern comprises at least one graphic. The graphic is visible when the display is viewed with reflected light and the graphic is substantially less visible or invisible when viewed with backlighting transmitted through the metal micropatterned substrate. The graphic and contrasting area have a total metal micropattern density that differs by no greater than about 5% and more preferably by no greater than 2%.

In each of the embodiments, the graphic is preferably selected from a logo, trademark, picture, text, indicia, or insignia. The micropattern features comprise an arrangement of dots, lines, filled shapes, or a combination thereof. The lines may form unfilled shapes. In some favored embodiments, the graphic is a visible graphic having, at least two dimensions of at least 0.5 mm. Particularly for embodiments wherein the metal pattern further provides an electronic function, the micropattern features may comprise linear micropattern features that form a metal mesh cell design and (i.e. additional) micropattern features disposed in open spaces of the mesh.

DETAILED DESCRIPTION

Figure 1:
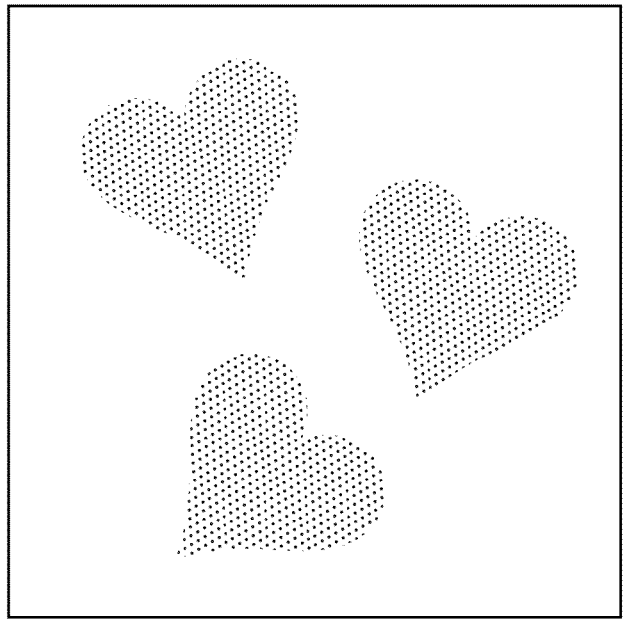
FIG. 1 is an illustration of a metal pattern having heart-shaped graphics.

The present invention is directed to (e.g. transparent) substrates comprising a metal micropattern and electronic displays comprising a metal micropatterned transparent substrate. The metal micropattern comprises at least one graphic defined by a contrasting area adjacent the graphic. In some embodiments, at least a portion of the metal micropattern provides an electronic function. In other embodiments, the metal micropattern (e.g. solely) provides an optical design effect, thereby forming a visible graphic.

As used herein "micropattern features" refers to an arrangement of dots, lines, filled shapes, or a combination thereof having a dimension (e.g. line width) at least 0.5 microns and typically no greater than 20 microns. The dimension of the micropattern features can vary depending on the micropattern selection. In some favored embodiments, the micropattern feature dimension (e.g. line width) is less than 10, 9, 8, 7, 6, or 5 micrometers (e.g. 1-3 micrometers).

Although the micropattern features of the graphic and/or contrasting area provide the visibility of the graphic, the metal pattern may also comprise larger pattern features, having a dimension greater than 20 microns.

The selection of micropattern features affects the visibility of the graphic. Some micropattern features result in the graphic having substantially the same visibility when viewed with reflected light as when viewed with transmitted light. Other micropattern features result in the graphic being (e.g. highly) visible when viewed in reflection, yet substantially less visible or invisible when viewed in transmission (e.g. with backlighting from an illuminated electronic display).

In some embodiments, it is desirable to select micropattern features to exploit diffractive phenomena to generate visibility under certain lighting conditions.

As such, in some embodiments, it is preferred that micropattern features include dimensions or spacing between features that is less than approximately 20 microns, and more preferably less than 15, 10, 9, 8, 7, or 6 microns. Preferred metal micropatterns that diffract light include micropattern features or spacing between micropattern features of less than 5 microns, more preferably less than 4 microns, and even more preferably less than 3 microns.

One example of diffractive phenomena leading to visibility is the separation of incident directional (e.g. nearly collimated, as derived from a point source at a large distance from the article) white light into spectral components reflected in different directions that gives rise to a rainbow appearance, particularly when viewed in reflected white light. This is known as a diffraction effect of dispersion. Diffraction can also lead to an appearance of distortion or depth for the graphic or contrasting area. This latter aspect of diffractive phenomena can provide metal micropatterned substrates having a holographic appearance.

As used herein "graphic" refers to a written or pictorial representation such as a logo, trademark, picture, text, indicia (i.e. identifying marks), insignia (i.e. distinguishing sign), or artistic design. Artistic designs are typically (e.g. non-functional) decorative designs. A linear uniform repeating micropattern such as conductive mesh bars is not an "artistic" design.

In some favored embodiments, the metal micropattern comprises one or more "visible graphics" of sufficient size that the graphic is apparent (i.e. readily seen, visible) and identifiable (i.e. to ascertain definitive characteristics of) to the unaided human eye of normal (i.e. 20/20 vision). By "unaided", it is meant without the use of a microscope or magnifying glass.

The size of the graphic is dependent at least in part by the normal viewing distance. For example, if the graphic is present on a small display, such as a watch face, personal data assistant or mobile phone, wherein the typically viewing distance is about 20-50 centimeters, the graphic has at least one visible dimension of at least 0.5 mm. For larger displays, such as standard sized computer monitors, large screen televisions, or billboards, the graphic would typically be larger, having at least one visible dimension of at least 1 mm (e.g. for a 20 cm×20 cm) computer monitor. In some embodiments, the graphic has at least two orthogonal dimension that are at least 0.5 mm, 1 mm, 2 mm, 3 mm, 4 mm or 5 mm. The graphic typically has at least one (i.e. visible) dimension that is at least 0.1%, 0.2%, 0.3%, 0.4%, or 0.5% up to about 10% of the overall area of the metal micropatterned substrate or display.

Alternatively, or in combination with comprising at least one visible graphic, the metal pattern may comprise a micrographic (i.e. having one or both dimensions of less than 0.5 mm). A micrographic would typically require magnification to be identifiable. Micrographics have particular utility for covert authentication markings. However, covert authentication markings are typically identifying marks, rather than merely a design.

The graphic is generally defined by a contrasting area adjacent the graphic. The graphic has one or more micropattern features that differ from the micropattern features of the contrasting area adjacent the graphic. The graphic perceived by the unaided average human eye is substantially (e.g. at least 25 times) larger than the micropattern features that give rise to the appearance of the graphic(s) or contrasting area.

In some embodiments, such as when the graphic is present in a center portion of a metal micropattern (e.g. of a display), the contrasting area is at least the (e.g. metal micropatterned) peripheral area adjacent (e.g. surrounding) the graphic by a visually resolvable distance to the unaided human eye. The contrasting area provides at least an outline of the graphic, the outline typically having a width of at least about 0.5 mm, 1 mm or 2 mm. In other embodiments, such as when the graphic is at a corner of a display, the contrasting area is the portion of the metal micropattern (e.g. of the display) adjacent the graphic. In this embodiment, the graphic is also contrasted by the edge of the display.

Figure 2:
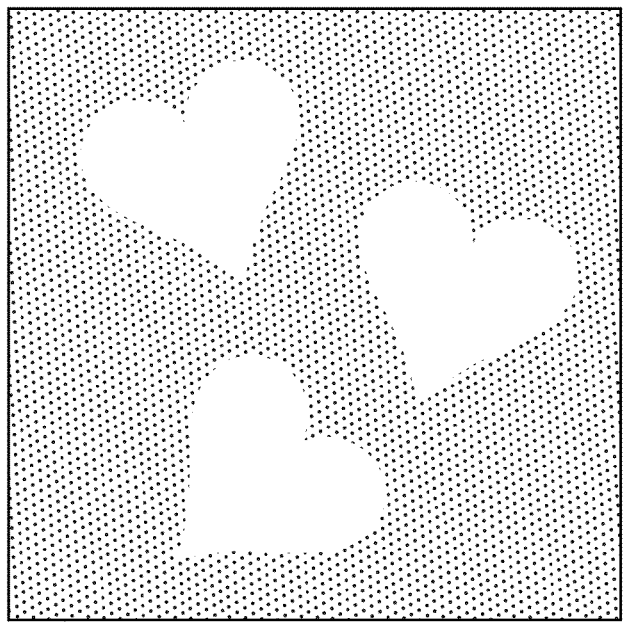
FIG. 2 is another illustration of a metal pattern having heart-shaped graphics.

In some embodiments, the contrasting area is substantially free of metal micropattern features, while the graphic comprises micropattern features. For example, FIG. 1 is an illustration of a metal pattern forming heart-shaped graphics. In other embodiments, the graphic is substantially free of metal micropattern features, while the contrasting area comprises micropattern features. For example, FIG. 2 is another illustration of a metal pattern forming heart-shaped graphics.

In yet other embodiments, both the graphic and contrasting area comprise micropattern features that sufficiently differ such that the graphic is visible. For example, FIG. 9 is an illustration of a metal pattern having an arrangement of non-contiguous linear pattern features having a first orientation in the heart-shaped graphics of the micropattern and a different orientation in the contrasting area adjacent the graphics.

For illustration purposes, the individual pattern (i.e. dot or lines) features of FIGS. 1-2 and 7-10 are apparent and identifiable as individual pattern features. However, when the pattern features are micropattern features (e.g. no greater than 20 microns in dimension), the individual (e.g. dots or lines) pattern features are not identifiable. Rather, the micropattern features give rise to an average (e.g. shadowed) appearance for the graphic and/or the contrasting area of the metal micropatterned substrate or display.

Figure 9:
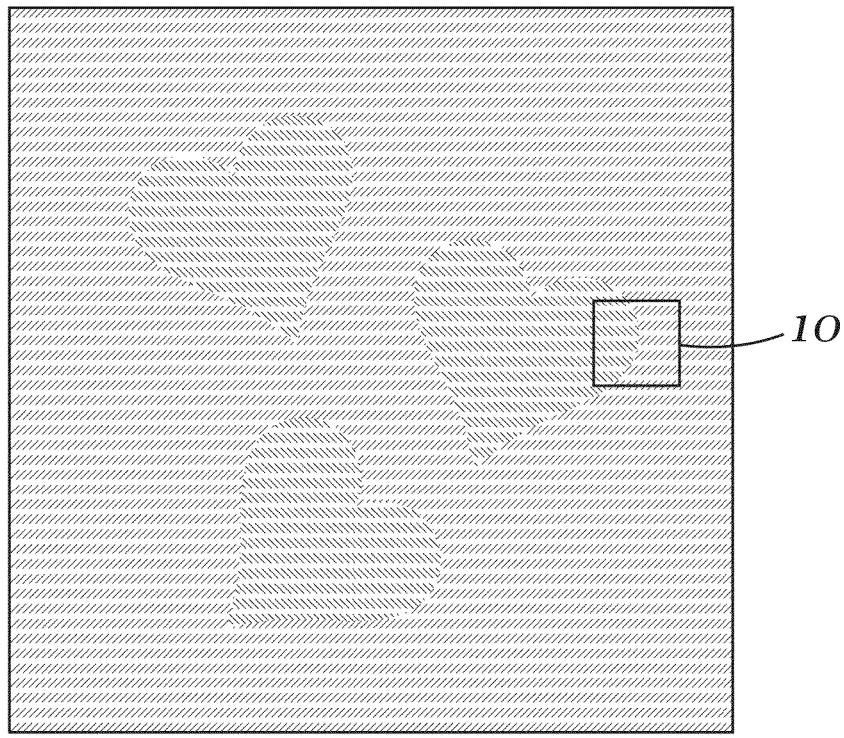
FIG. 9 is an illustration of a metal pattern having an arrangement of non-contiguous linear micropattern features having a first orientation in the heart-shaped graphics of the micropattern and a different orientation in the contrasting area adjacent the graphics.

As depicted in FIGS. 1 and 9, the metal micropattern may be the same throughout the graphic area. Likewise, as depicted in FIG. 2, the metal micropattern may be the same throughout the contrasting area. Alternatively, the metal micropattern may include one or more contrasting area portions, wherein the portions differ from each other and also differ from the graphic. Further, portions of the contrasting area may be the same as the graphic, provided that that the contrasting area has sufficient differences such that the graphic is apparent and identifiable.

In some favored embodiments, at least a portion of the metal micropattern of the metal micropatterned substrate provides an electronic function. For example, when the metal micropattern is of low density, is contiguous, and is formed on a transparent substrate, it may be useful as a transparent shield for electromagnetic interference (EMI) and the like for a display.

Alternatively or in combination with being useful as an EMI shield, in some embodiments, at least a portion of the metal micropattern is contiguous and in electrical connection with circuitry of an electronic illuminated display such as touch sensor controller electronics of a display.

Touch sensor displays are known in the art and generally include a touch screen panel having a touch sensing area that is electrically coupled to a touch sensor drive device. The touch screen panel is typically incorporated into an electronic display device, for example an illuminated electronic display device (i.e. the electronic display device comprises the touch panel). The touch panel may be for example a resistive, surface capacitive, or projected capacitive type. The touch sensing area typically includes a visible light transparent substrate and an electrically conductive micropattern made of metal disposed on or in the visible light transparent substrate.

The electrically conductive micropattern can be formed of a plurality of linear metal micropattern features (often referred to as metal traces) that form a two dimensional contiguous metal mesh. In some embodiments, the touch sensing area includes two or more layers of visible light transparent substrate, each having a (i.e. conductive) metal micropattern. When the display includes two or more layers of visible light transparent substrate, each having a (e.g. conductive) metal micropattern, the graphic may be formed from a portion of pattern features of (e.g. within) the first layer (e.g. overlayed with) a portion of pattern features of (e.g. within) the second layer.

Depending on the method of making the metal micropattern, the metal micropattern may comprise (e.g. two dimensional) parallel linear traces (e.g. metal patterned wires).

Preferred (i.e. conductive) metal micropatterns include regions with two dimensional contiguous metal meshes, e.g. square grids, rectangular (non-square) grids, or (e.g. regular) hexagonal networks, where conductive micropattern features such as micropatterned lines define enclosed open areas within the mesh. The open spaces defined by the metal micropatterns can be described as cells. Other useful geometries for mesh cells include random cell shapes and irregular polygons.

The metal micropattern of the (e.g. transparent) substrate may be described as comprising multiple micropatterns or micropattern portions. The metal micropattern may include a contiguous metal (e.g. mesh) micropattern and additional (i.e. non-contiguous or contiguous) micropattern features. In such embodiments, the "total metal micropattern" includes all the metal micropattern features.

The total metal micropattern or the contiguous metal micropattern portion can be described with reference to the total surface area of open spaces. In some embodiments, the total metal micropattern or contiguous metal micropattern portion has an open area of at least 60%, 70%, 80%, 90%, 91%, 92%, 93%, 94%, or 95%. In preferred embodiments, the contiguous metal micropattern portions have an open area of at least 96%, 97%, 98%, 99%, or even at least 99.5%.

In other embodiments, the metal micropattern may solely provide an optical design effect of providing a graphic that is visible when illuminated by reflected light (e.g. ambient light). For example, the metal micropattern may be present on a portion of a protective (e.g. cover) film for an electronic display (e.g. an illuminated display) or may be present on a portion of (e.g. privacy) window film. For such embodiments, the metal micropattern does not serve an electrical function and thus may be free of contiguous metal micropatterns. In this embodiments, the metal micropattern may only cover a portion of the display surface and may only be slightly larger than the graphic itself.

In some embodiments, a (e.g. transparent) substrate is described comprising a metal micropattern comprising non-contiguous micropattern features. By non-contiguous, it is meant that the micropattern features are unconnected to each other. In some embodiments, the micropattern features are also non-contiguous (i.e. unconnected to) a contiguous metal pattern portion.

The non-contiguous micropattern features may comprise an arrangement of dots, lines, filled shapes, or a combination thereof. Further, the lines (i.e. linear micropattern features) may be arranged to form unfilled shapes such as circles, polygons, hearts, stars, etc. The arrangement of micropattern features (e.g. dots, lines, or filled shapes) may take the form of an array, characterized by translational or rotational symmetry. Alternatively, the arrangement of micropattern features may lack spatial regularity and thus comprise a pseudo-random arrangement of micropattern features or a micropattern feature gradient. For example, the graphic may have a higher density of micropattern features at the peripheral edges of a graphic than the center of a graphic. Or the graphic may have a micropattern feature density that reduces over an area such that the graphic appears to fade.

In some favored embodiments, such as illustrated by FIG. 1, the graphic comprises non-contiguous micropattern features and the contrasting area lacks (e.g. non-contiguous) micropattern features.

In some embodiments, as depicted in FIGS. 3-6, the metal micropattern further comprises a contiguous metal micropattern such as a metal hexagonal mesh micropattern and (e.g. additional) micropattern features disposed in open spaces of the mesh.

Figure 3:
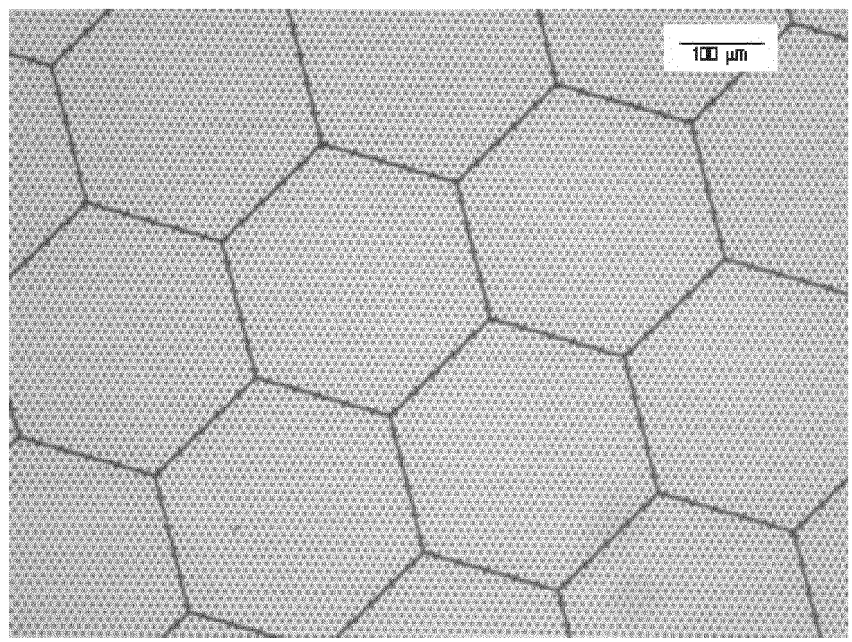
FIG. 3 is an optical photomicrograph of a metal micropattern having a contiguous hexagonal metal mesh micropattern and an arrangement of non-contiguous (i.e. dot) micropattern features.
Figure 4:
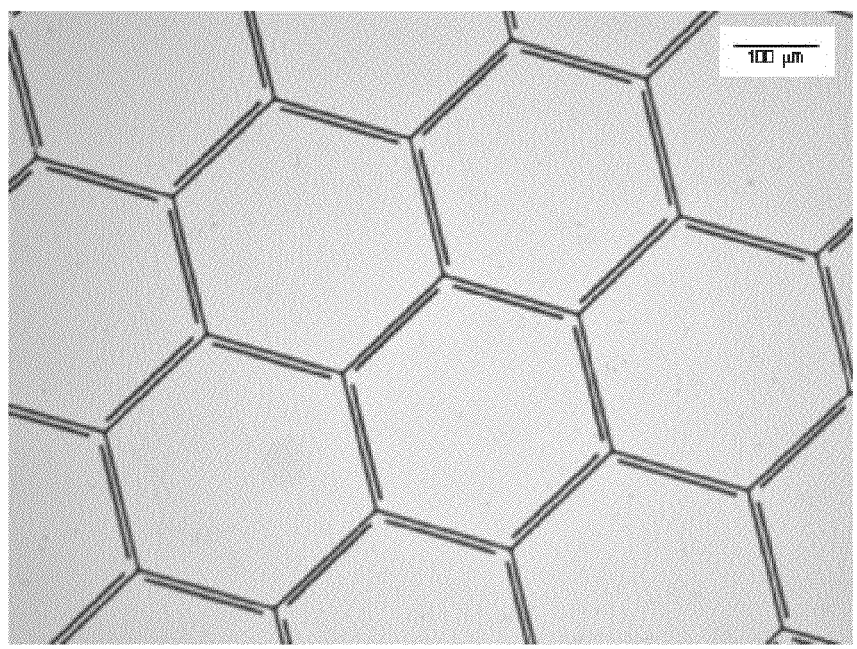
FIG. 4 is an optical photomicrograph of a metal micropattern having a contiguous hexagonal metal mesh micropattern and an arrangement of non-contiguous linear micropattern features having the same orientation as the hexagonal metal mesh micropattern.

With reference to FIG. 3, an optical photomicrograph of a metal micropattern having a contiguous hexagonal metal mesh micropattern, the graphic may comprise an arrangement of (e.g. dot) micropattern features, and the contrasting area (not shown) is free of non-contiguous (e.g. dot) micropattern features. With reference to FIG. 4, an optical photomicrograph of a metal micropattern having a contiguous hexagonal metal mesh micropattern, the graphic may comprise an arrangement of non-contiguous linear micropattern features, with the contrasting area (not shown) being free of non-contiguous linear micropattern features. In FIG. 4, the non-contiguous linear micropattern features have the same orientation as line features defining the hexagonal metal mesh micropattern.

Linear micropattern features having the same orientation are substantially parallel to each other (e.g. within 0-5 degrees). A line segment of a metal micropattern feature may be straight or curved. The orientation of a line, at a point along the line, is taken to be the direction of a vector given by constructing a tangent to the line feature at that point. For the purpose of designating the angle between the orientations of two lines, the directions of tangent vectors are chosen such that the angle is the acute or right angle that is possible based on the aforementioned procedure for defining the orientation.

Alternatively, the graphic may be free of non-contiguous micropattern features, with the contrasting area comprising non-contiguous micropattern features. In this embodiment, FIGS. 3 and 4 would depict the contrasting area, rather than the graphic.

Figure 5:
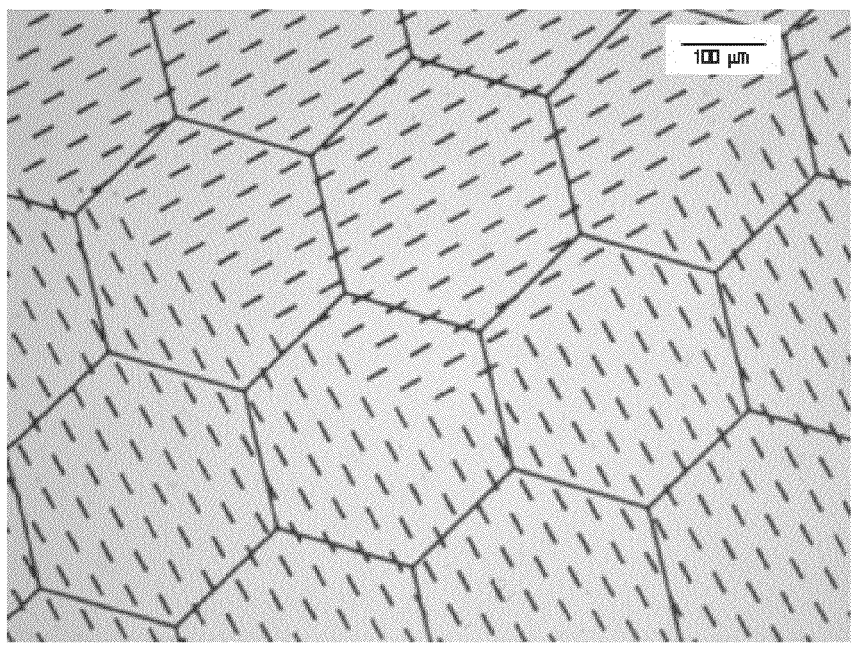
FIG. 5 is an optical photomicrograph of a metal micropattern having a contiguous hexagonal metal mesh micropattern and an arrangement of non-contiguous linear micropattern features having a first orientation in a graphic portion of the micropattern and a different orientation in the contrasting area adjacent the graphic portion.

As depicted in FIGS. 3 and 5, although the vast majority of micropattern features are not in contact with the contiguous hexagonal metal mesh micropattern, a minor number (e.g. less than 20%) of micropattern features may be in contact with or intersect with the contiguous metal micropattern. In some favored embodiment, these intersections generally do not affect the electrical properties of the contiguous metal micropattern.

Figure 6:
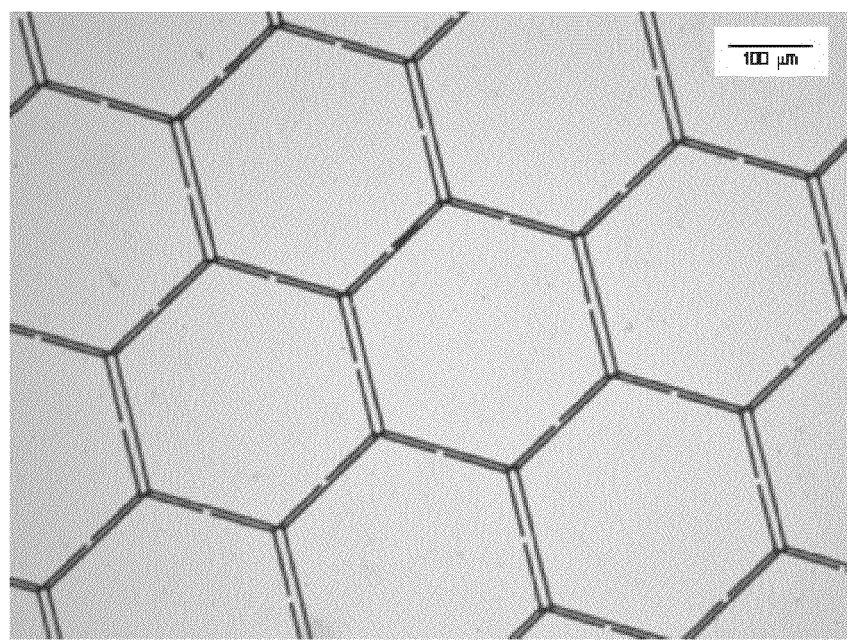
FIG. 6 is an optical photomicrograph of a metal micropattern having a contiguous hexagonal metal mesh micropattern and an arrangement of contiguous linear micropattern features having the same orientation as the hexagonal metal mesh micropattern.

However, in other embodiments, such as depicted in FIG. 6, such intersections would typically affect the electrical properties. FIG. 6, is an optical micrograph of a metal micropattern that further comprises a contiguous metal micropattern such as a metal (e.g. hexagonal) mesh micropattern. The graphic, contrasting area, or a combination thereof comprises parallel linear pattern features, i.e. linear pattern features of the same orientation.

Dot shaped pattern features are particularly useful for creating a rainbow appearance diffraction effect. Further, parallel linear micropattern features, such as depicted in FIGS. 4 and 6, are particularly useful for producing a holographic appearance.

In yet other embodiments, both the graphic and contrasting area comprise non-contiguous micropattern features that sufficiently differ from each other such that the graphic is visible. The non-contiguous micropattern features of the graphic may differ from the contrasting area in (i.e. micropattern) density, (i.e. micropattern) feature dimension, (i.e. micropattern) feature shape, (i.e. micropattern) feature orientation, or a combination thereof.

For example, both the graphic and contrasting area could comprise (e.g. dot) micropattern features of the same dimension (e.g. dot diameter), with the graphic having more dots per unit area than the contrasting area, or vice-versa. As another example, the graphic could comprise (e.g. dot) micropattern features having a larger dimension (e.g. dot diameter) than the contrasting area, or vice-versa. As yet another example, the graphic and contrasting area may comprise non-contiguous micropattern features that differ in micropattern feature shape. For example, the contrasting area may comprise linear micropattern features, such as depicted in FIG. 4 and the graphic may comprise an arrangement of dots, such as shown in FIG. 3.

With reference to FIG. 5, in a favored embodiment, the metal micropattern comprises linear micropattern features that form a metal mesh cell design and non-contiguous micropattern features disposed in open spaces of the mesh that are non-parallel relative to each other. Further, the depicted non-contiguous pattern features are also non-parallel to the linear micropattern features of the metal mesh cell design.

As illustrated by the forthcoming examples, it has been found that when both the graphic and contrasting area each comprise non-contiguous micropattern features that differ in orientation, the graphic can be (e.g. highly) visible when viewed in reflection, yet substantially less visible or invisible when viewed in transmission. This is a desirable visual design effect regardless of whether the metal micropattern has any other (e.g. electrical) function.

Figure 10:
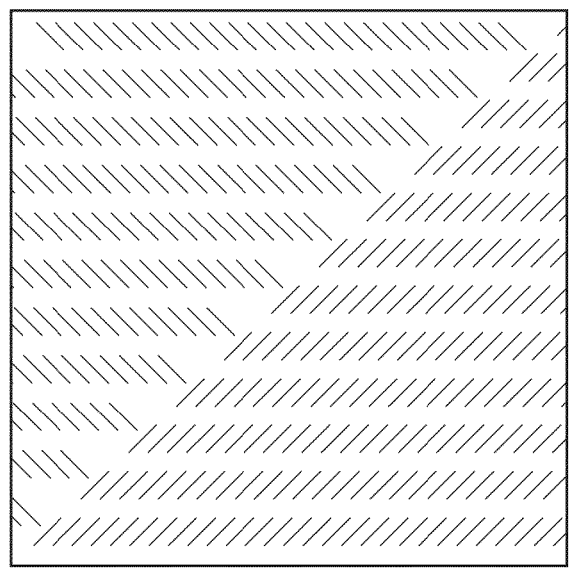
FIG. 10 is an illustration of the heart-shaped graphic pattern and contrasting adjacent area of portion 10 of FIG. 9.

Hence, in another embodiment, such as illustrated by FIGS. 9 and 10, a transparent substrate is described wherein the metal micropattern comprises at least one graphic and a contrasting portion adjacent the graphic wherein the contrasting area comprises micropattern features having a different orientation than the graphic (such that the graphic is viewable).

With reference to FIGS. 5, 9 and 10 micropattern features of a different orientation are non-parallel to each other. In this embodiment, the micropattern features may not be dots or other rotational symmetrical shapes having the same appearance regardless of orientation. The micropattern features may be filled or unfilled shapes and are typically linear micropattern features. The (e.g. linear) micropattern features of the contrasting area are typically rotated at least 10, 20 or 30 degrees. As the angle of rotation increases, the visibility of the graphic also increases. In some preferred embodiments, the (e.g. linear) micropattern features of the contrasting area are typically rotated preferably rotated at least 40, 50, 60, 70, 80, or about 90 degrees relative to the micropattern features of the graphic.

As illustrated for Example in FIG. 10, the interface between a graphic comprising non-contiguous pattern feature of a first orientation and the contrasting area may comprise a combination of contrasting portions that lack (e.g. non-contiguous) pattern features and portions that comprise micropattern features of a different orientation.

In some embodiments, at least 5%, 10% or 25% by area of all of the metal micropattern features of the contrasting area have a different orientation than the graphic. In other embodiments, at least 50%, 75%, or greater, (e.g. all) of the metal micropattern features of the contrasting area have a different orientation than the graphic.

Figure 7:
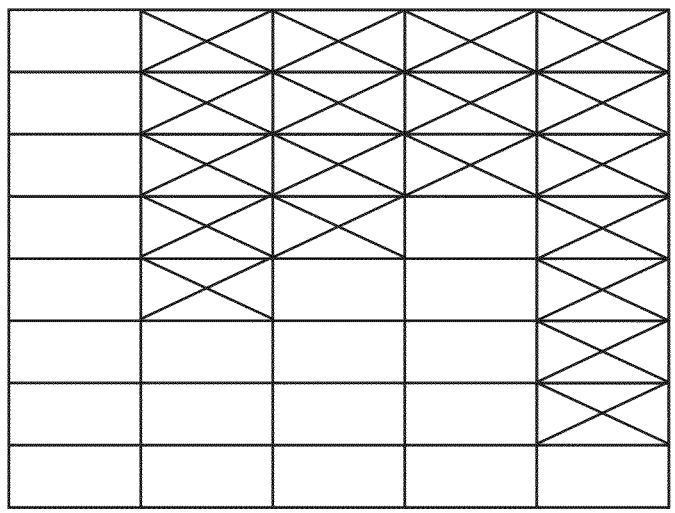
FIG. 7 is an illustration of a metal pattern having a contiguous rectangular metal mesh pattern and an arrangement of contiguous linear pattern features having a different orientation than the metal mesh pattern.
Figure 8:
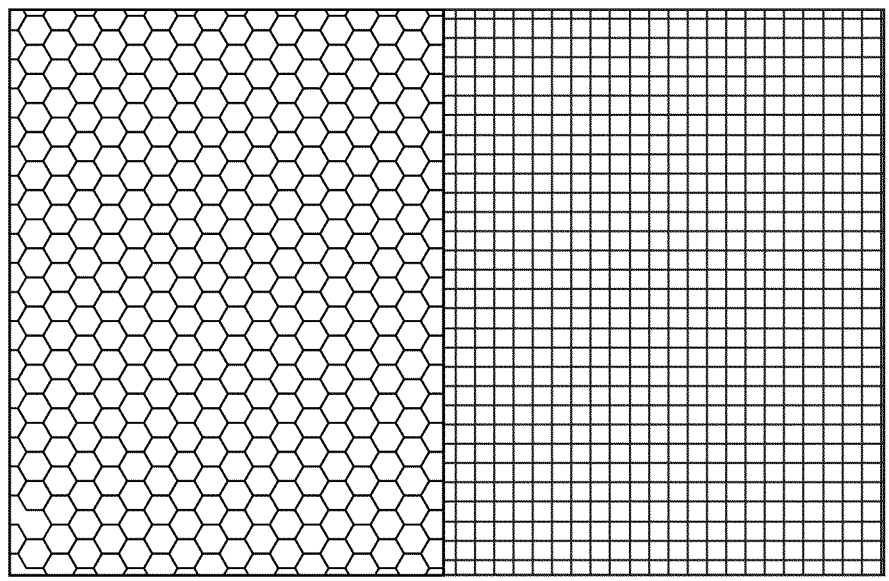
FIG. 8 is an illustration of a metal pattern having a contiguous hexagonal metal mesh pattern and a contiguous (i.e. rectangular) metal mesh micropattern having (i.e. linear pattern features) having a different orientation.

With reference to FIGS. 7-8, micropattern features having different orientations can also be employed in metal micropatterns wherein at least a portion of the metal micropattern is contiguous and in electrical connection with circuitry of an electronic display. In this embodiment, the graphic may also be in electrical connection with the circuitry of the electronic display.

FIG. 7 is an illustration of contiguous metal micropattern such as a rectangular metal mesh micropattern. A portion of the open spaces of the mesh comprise (i.e. linear) micropattern features that form an "X" in a portion of the cells. The cells including these additional "X" linear pattern feature form a portion of a graphic, or vice-versa. Although, the "X" (i.e. linear) micropattern features have the same orientation as each other, these linear pattern features are non-parallel to the linear micropattern features of the rectangular metal mesh and thus have a different orientation. Further, the "X" micropattern features are contiguous with the rectangular metal mesh and thus are in electrical connection with the circuitry of the electronic display.

FIG. 8 is an illustration of a contiguous (e.g. hexagonal) metal mesh micropattern that forms a portion of a graphic adjacent to a (rectangular) metal mesh micropattern. Although, a portion of the linear micropattern features of the hexagonal metal mesh are parallel to the linear micropattern feature of the rectangles, a major portion (i.e. at least 50%) of the linear micropattern features of the hexagonal mesh have a different orientation.

The graphic and contrasting area of the metal micropattern of the (e.g., transparent) substrate can be characterized by a determining the total metal micropattern density for the graphic, the contrasting area, or the entire metal micropattern. The total metal micropattern density of an area is the total metal of any metal micropatterns that exist divided by the area.

In some embodiments, the graphic has a greater total metal micropattern density than the density of the contrasting area by inclusion of the additional micropattern features, or vice-versa. The difference in total metal micropattern density between the graphic and the contrasting area is typically no greater than 20%, 15%, or 10%.

The total metal micropattern density of a region of a metal micropatterned transparent substrate affects light transmittance of that region (light transmittance being the percentage of incident light that passes through the substrate). As the total metal micropattern density of the graphic increases, the visibility of the graphic when viewed in reflection also increases.

As the total metal micropattern density of the graphic decreases, the total area the graphic(s) can occupy while maintaining at least the same transmission increases. In preferred embodiments, the metal micropatterned substrate has a transmission of at least 80%, 85%, or 90% of at least one polarization state of visible light, where the % transmission is normalized to the intensity of the incident, optionally polarized light.

When the total metal micropattern density of the graphic is relatively high 10-20%, the graphic typically only occupies a small fraction (e.g. 0.1% to 10%) of the total metal micropatterned substrate, especially in the case of electronic displays. This ensures that the transmission of the total metal micropatterned substrate (i.e. including both the graphic and contrasting area) is no less than 70% or 75%.

In some embodiments, such as depicted in FIGS. 4-6, the total metal micropattern density of the graphic is no greater than 10%, 9%, 8%, 7%, or 6%. In preferred embodiments the total metal micropattern density, e.g. the difference in micropattern density between the graphic and contrasting area, does not vary by more than 5%, 4%, 3%, or 2%. In more preferred embodiments, the total metal micropattern density differs by no more than 1%, 0.5%, 0.25%, or 0 (i.e. no difference at all). For uniformity in the appearance of (i.e. powered on) illuminated display, the difference in total metal micropattern density is preferably small, particularly when the metal micropattern is in the optical path of the entire viewable area of the display.

As the difference in total metal micropattern density between the graphic and the contrasting area increases, the visibility of the graphic also increases when viewed in transmission, e.g. as is the case for viewing primarily with light that originates within an illuminated electronic display, when the metal micropatterned transparent substrate is integrated with the display and the light originating within the display is transmitted through the substrate to the viewer.

In some embodiments, it is preferred that the graphic exhibits high visibility in reflection and that the graphic have low visibility relative to the contrasting area when viewed in transmission, e.g. when viewed with backlighting transmitted though the metal micropatterned substrate such as provided by an illuminated display.

In some embodiments, the total metal micropattern density of the graphic relative to the contrasting area can be described by calculating a contrast ratio (i.e. the difference divided by the lower density region). Higher total metal micropattern contrast ratios between the graphic and the contrasting region will lead to higher visibility for the graphic when viewed in transmission. Thus, for embodiments where the visibility of the graphic in transmission is desired to be low, the contrast ratio is preferably less than 10 or 5, and more preferably less than 2, 1.50, 1.25, or 1.10.

The metal micropatterned (e.g., transparent) substrates described herein can be prepared by etching a metal coating in a micropattern on a substrate (e.g., transparent substrate), by micropatterning functionalizing molecules to provide a self-assembled monolayer micropattern. This can be achieved using a number of different techniques including microcontact printing, dip-pen nanolithography, photolithography, and ink-jet printing.

In some embodiments, the metal micropatterned substrates are suitable for use in electronic displays. Electronic displays include reflective displays and displays with internal sources of light. Electronic displays with internal sources of light include illuminated displays. By "illuminated" it is meant "brightened by light or emitting light". The illuminated display may be a liquid crystal display having a backlighting or edge lighting light source that may be external to the core liquid crystal panel but internal to the display device overall. Or the illuminated display may be an emissive display such as a plasma display panel (PDP) or organic light emitting diode (OLED) display. Reflective displays include electrophoretic displays, electrowetting displays, electrochromic displays, and reflective cholesteric liquid crystal displays. The metal micropatterned substrates of the invention are especially useful as part of an illuminated electronic display.

In one favored embodiment, the graphic is visible when the display is viewed primarily with reflected light (e.g. such as when an illuminated electronic display is powered off) and the graphic is substantially less visible and preferably invisible when viewed with light that originated from within the display and transmitted through the metal micropatterned substrate, such as when an illuminated electronic display is powered on.

"Self-assembled monolayer" generally refers to a layer of molecules that are attached (e.g., by a chemical bond) to a surface and that have adopted a preferred orientation with respect to that surface and even with respect to each other. Self-assembled monolayers have been shown to cover surfaces so completely that the properties of that surface are changed. For example, application of a self-assembled monolayer can result in a surface energy reduction and allow selective etching of metal that is not coated with the self-assembled monolayer.

Microcontact printing uses micropatterned elastomeric stamps, typically made from polydimethyl siloxane (PDMS) that are inked and placed onto a substrate to localize a chemical reaction between molecules of the ink that are able to form a self-assembled monolayer (SAM) and the substrate. The micropatterned SAM resulting from such technique have served as a resist for selectively etching metal and metalized substrates, to form electrically conductive micropatterns.

The metal micropatterned substrate can generally be formed from any metal or metalized substrate. As used herein, "metal" and "metalized" refers to an elemental metal or alloy that is suitably conductive for the intended purpose.

Although metal patterned articles only intended to have a visible design when viewed in reflection could employ an opaque substrate such as a silicon wafer, in preferred embodiments, the metalized substrate is typically a metal-coated visible light transparent substrate.

As used herein, "visible light transparent" refers to the level of transmission of unmetalized regions of the substrate being at least 40%-90% transmissive to at least one polarization state of visible light, where the % transmission is normalized to the intensity of the incident, optionally polarized light, more preferably at least 80% or even 90%.

Common visible light transparent substrates include glass and polymeric films. A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from about 5 μm to 1000 μm. In many embodiments, polymeric film thicknesses range from about 25 μm to about 500 μm, or from about 50 μm to about 250 μm, or from about 75 μm to about 200 μm. Roll-to-roll polymeric films may have a width of at least 12 inches, 24 inches, 36 inches, or 48 inches.

Useful polymeric films include thermoplastic and thermoset polymeric films. Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), polyethylene terephthalate, and poly(vinylidene fluoride). Other useful polymer films that are useful as substrates include absorptive polarizing films, for example polarizing films based on polyvinyl alcohol.

In some methods to fabricate the metal micropatterned transparent substrate, the (e.g. polymeric film) substrate first has a metallic coating disposed on at least one major surface. The surface of a substrate with a metallic coating disposed thereon is described herein as a metalized surface of a substrate. The metallic coating is typically a continuous metal coating that is then SAM micropatterned. The SAM-micropatterned metal regions are retained on the substrate and the metal of the unmicropatterned regions is removed by wet etching, thereby forming a metal micropattern.

Alternatives to SAM-based micropatterning for the metal micropattern include photolithography with coated or laminated photoresist polymers, combined with etching or lift-off techniques, as are known in the art.

The metallic coating can be deposited using any convenient method, for example sputtering, evaporation, chemical vapor deposition, or chemical solution deposition (including electroless plating).

The metallic coating comprises elemental metal, metal alloys, intermetallic compounds, metal sulfides, metal carbides, metal nitrides, or combinations thereof. Exemplary metals include gold, silver, palladium, platinum, rhodium, copper, nickel, iron, indium, tin, tantalum, aluminum, as well as mixtures, alloys, and compounds of these elements. In some embodiments, preferred metals include metals that are effectively colorless in their reflection (for example, silver as opposed to copper). This, in some embodiments, preferred metals include silver, aluminum, nickel, palladium, and tin. Although still useful, less preferred metals include copper. Although conductive, copper exhibits colored reflection that can serve to undermine the visibility or impact of the graphic in reflected light. In some embodiments, the metal of the metal micropattern is any metal other than copper.

The metallic coatings can be various thicknesses. However, the thickness of the resulting conductive micropattern is generally equal to the thickness of the metallic coating.

In some embodiments, the metal micropatterns is relatively, ranging in thickness from about 5 nanometers to about 50 nanometers. In other embodiment, the metal micropattern thicknesses, of at least 60 nm, 70 nm, 80 nm, 90 nm, or 100 nm. In some embodiments, the thickness of the (e.g. conductive) metal micropattern is at least 250 nm. In some embodiments, the silver micropatterns have thicknesses of at least 300 nm, 400 nm, 500 nm, 600 nm, 700 nm, 800 nm, 900 nm, and even 1000 nm or greater. The other embodiments, the gold micropatterns have thicknesses of at least 300 nm, 350 nm, 400 nm, or greater. Metal micropatterns of increased thickness can be prepared as described in 61/220,407; incorporated herein by reference.

Microcontact printing typically utilizes a relief-micropatterned elastomeric stamp. Useful elastomers for forming the stamp include silicones, polyurethanes, ethylene propylene diene M-class (EPDM) rubbers, as well as the range of existing commercially available flexographic printing plate materials (for example, commercially available from E. I. du Pont de Nemours and Company, Wilmington, Del., under the trade name Cyrel™). The stamp can be made from a composite material (for example, one of the aforementioned elastomers combined with a woven or non-woven fibrous reinforcement). Polydimethylsiloxane (PDMS) is particularly useful as a stamp material, as it is elastomeric and has a low surface energy (which makes it easy to remove the stamp from most substrates). PDMS is also commercially available. A useful commercially available formulation is Sylgard™ 184 PDMS (Dow Corning, Midland, Mich.). PDMS stamps can be formed, for example, by dispensing an uncrosslinked PDMS polymer into or against a micropatterned mold, followed by curing. The micropatterned features can be, for example, millimeter-sized, micrometer-sized, nanometer-sized, or a combination thereof.

The master tool for molding the elastomeric stamps can be generated by preparing a micropatterned photoresist using photolithography as known in the art. The elastomeric stamp can be molded against the master tool by applying uncured PDMS to the master tool and then curing.

Microcontact printing can be carried out by using a relief-micropatterned stamp or printing plate made of elastomer in combination with a substantially flat substrate in order to transfer to the substrate a micropatterned self-assembled monolayer (SAM) according to the relief micropattern of the stamp or plate. Alternatively, microcontact printing can be carried out by using a substantially flat stamp or printing plate made of elastomer in combination with a relief-micropatterned (or structured or microstructured) substrate (for example, a coated polymer film with embossed surface structure on a major surface) in order to transfer to the substrate a micropatterned self-assembled monolayer (SAM) according to the relief micropattern of the substrate (as described, for example, in U.S. Patent Application Publication No. 2008-0095985-A1 (Frey et al.), the description of which is incorporated herein by reference).

The "ink" comprises molecules capable of forming a self-assembled monolayer. Various molecules that form a self-assembled monolayer (SAM) are known. Such molecules include various organosulfur compounds including for example alkylthiols, dialkyl disulfides, dialkyl sulfides, alkyl xanthates, dithiophosphates, and dialkylthiocarbamates. The molecules are characterized by a tail group or groups attached to a sulfur atom, wherein the tail group or groups have between 14 and 20 atoms along their backbone, preferably 16, 17, or 18 atoms. The atoms along the backbone are preferably carbon atoms.

Preferably the ink solution comprises alkyl thiols such as, for example, linear alkyl thiols:

$$HS(CH_2)_nX$$

where n is the number of methylene units and X is the end group of the alkyl chain (for example, X=—$CH_3$, —OH, —COOH, —$NH_2$, or the like). Preferably, X=—$CH_3$ and n=15, 16, or 17, corresponding to chain lengths of 16, 17, or 18, respectively. Other useful chain lengths include 19 and 20. For linear molecules bearing a sulfur-containing head group for attachment to a metal, the chain length is determined as the number of atoms along the linear arrangement of bonded atoms between and including the atom that is bonded to the sulfur atom and final carbon atom in the linear arrangement. The monolayer-forming molecule may comprise other end groups or be branched (e.g. with side groups) provided that the molecule is suitable to form a self-assembled monolayer that functions as an etch resist. The SAM-forming molecules may also be partially fluorinated or perfluorinated, for example as described in U.S. Patent Application Ser. No. 61/121,605, filed Dec. 11, 2008.

As is known in the art, such printing can include a displacement reaction that results in removal or modification of an atom or functional group in the SAM-forming molecules (for example, conversion of a thiol (R—SH compound) to a thiolate (R—S-M) monolayer when the monolayer is formed on a metal (M), for example silver or gold). Thus, the resulting printed micropattern can comprise compounds or molecules that are chemically different from the molecules of the ink composition.

Optionally, but preferably, the ink compositions can further comprise at least one solvent.

Suitable solvents for use in the ink compositions include alcohols, ketones, aromatic compounds, heterocyclic compounds, fluorinated solvents, and the like, and combinations thereof. Other useful solvents include dimethylformamide, acetonitrile, dimethylacetamide, dimethylsulfoxide, ethyl acetate, tetrahydrofuran (THF), methyl t-butyl ether (MTBE), and the like, and combinations thereof.

Preferably, the solvent of the ink composition can be selected so as to evaporate relatively rapidly from the stamp surface, as this can also be helpful for achieving a relatively uniform distribution of the SAM forming molecules on or within the stamp with a minimum of time and application of forced air. The solvents are chosen such that the solvent does not excessively swell the (e.g. PDMS) stamp.

The ink compositions can comprise relatively small amounts of common additives (for example, stabilizers or desiccants), if desired, as known in the art.

The stamp can be "inked" with a composition comprising molecules capable of forming a SAM using methods known in the art.

The SAM micropatterned substrate can be used as a resist that protects the underlying substrate surface during a subsequent etching step. Thus, it can serve as an etch mask that protects against the action of an etchant, while the other region(s) (i.e. lacking the micropatterned monolayer) on the surface of the substrate are not protected, allowing selective removal of material (for example, metal) in the exposed region(s).

Etching refers to the removal of material, for example in a wet chemical solution by dissolution, chemical reaction, or a combination thereof. The unpatterened regions are preferably etched as described in 61/220,407.

The etching of the exposed region is selective, i.e. without significant etching of the surface regions comprising the SAM micropattern. In some embodiments, less than about 50% by mass of the SAM micropatterned regions are removed via wet etching per unit area. In preferred embodiments, less than about 25% by mass, less than about 10% by mass, or less than about 5% by mass of the SAM micropatterned regions are removed via wet etching per unit area. This can be determined by using known methods such as transmitted light attenuation, profilometry, mass analysis, or the like.

Useful chemical etching baths can be prepared by dissolving etchant species in water or a non-aqueous solvent (for example, with agitation or stirring, control of pH, control of temperature, and/or replenishment of etchant species upon their consumption, according to the nature of the etchant).

The etchant bath typically comprises at least one oxidizing agent. Suitable (e.g. small molecule) oxidizing agents include for example cyanide/oxygen, ferricyanide, and ferric ions.

The etchant bath also typically comprises at least one metal complexing compound such as thiourea $(NH_2)_2CS$ or a thiourea derivative (i.e. a class of compounds with the general structure $(R^1R^2N)(R^3R^4N)C=S$ wherein $R^1$, $R^2$, $R^3$, $R^4$ each are independently hydrogen atoms or some organic moiety such as ethyl or methyl). Thioureas are related to thioamides e.g. $RC(S)NR_2$, where R is methyl, ethyl, etc. Thiourea-based etchants with ferric ions as an oxidizing species are generally preferred etchant solutions, particularly for etching silver or gold.

The etchant may also comprise self-assembling monolayer forming molecules. However, good micropattern feature uniformity, increased metal micropattern thickness, or a combination thereof were obtained using a liquid etchant that is free of self-assembling monolayer forming molecules.

Once the metal of the unmicropatterned regions has been removed, the etchant (e.g., the oxidizing agent and metal complex forming molecule) is typically washed away from the surface of the etched microcontact printed metal micropattern. Although it is intended to completely remove the etchant, it is not uncommon for very small concentrations of the wet etchant components to remain. The presence of such wet etchant components can be determined by various quantitative and/or qualitative analysis such as surface-enhanced Raman scattering, X-ray photoelectron spectroscopy, Auger electron spectroscopy, secondary ion mass spectrometry, and reflectance infrared spectroscopy.

Metal micropatterned substrates of the current disclosure may be combined with (e.g. laminated with) coatings, films, or components serving other functions, for example hardcoats or hard-coated films, anti-smudge surface coatings or films, neon cut filter films, EMI shielding films, films or components with anti-reflective surfaces, films or components with adhesive layers or surfaces, optically clear adhesives, or polarizing films. Furthermore, metal micropatterned substrates of the current disclosure may be integrated (e.g. bonded directly) to an (e.g. illuminated) display.

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Metalized Polymer Film Substrates

Metalized polymer film substrates were provided were prepared by thermal evaporation of silver at a thickness of 70-100 nm onto 5 mil polyethyleneterephthalate "PET" (ST504, E. I. DuPont de Nemours and Company, Wilmington, Del.).

Stamp Fabrication

For each of the exemplified metal micropatterns of FIGS. 1-4, a master tool for molding elastomeric stamps was generated by preparing micropatterned photoresist (Shipley1818, Rohm and Haas Company, Philadelphia, Pa.) on 10-centimeter diameter silicon wafers using photolithography. The master tools had a micropattern of photoresist disposed thereon comprising trenches (photoresist material removed) in the micropattern of a hexagonal mesh of lines (hexagonal cell geometry with 97 percent open area and 3 micrometer wide lines forming hexagons). Each of the master tools had additional diffractive micropattern features that formed a (11 mm by 5.5 mm) "3M" graphic as will subsequently be described.

The geometry of thin film metal micropattern is the same as the geometry of recessed features or trench features in the master tool.

An elastomeric stamp was molded against the master tool by pouring uncured polydimethylsiloxane (PDMS, Sylgard™ 184, Dow Corning, Midland Mich.) over the tool to a thickness of approximately 3.0 millimeters. The uncured silicone in contact with the master was degassed by exposing to a vacuum, and then cured for 2 hours at 70° C. After peeling from the master tool, a PDMS stamp was provided with a relief micropattern comprising raised features approximately 1.8 micrometers in height. The raised features of the stamp were the lines defining the respective mesh geometry. The stamp was cut to a size of approximately 10 by 10 centimeters.

Inking

The stamp was inked by contacting its back side (flat surface without relief micropattern) to a solution of 5 mM octadecylthiol ("ODT" 00005, TCI AMERICA, Wellesley Hills, Mass.) in ethanol for 20 hours.

Stamping

Metalized polymer film substrates were stamped with the described inked stamp. For stamping, the metalized film was contacted to the stamp relief micropatterned-surface, which was faced up, by first contacting an edge of the film sample to the stamp surface and then rolling the film into contact across the stamp, using a roller with diameter of approximately 3.0 centimeters. The rolling step required less than 5 seconds to execute. After the rolling step, the substrate was contacted with the stamp for 10 seconds. Then, the substrate was peeled from the stamp, a step that required less than 1 second.

Etching

After stamping, the metalized film substrate with the SAM-printed micropattern was placed in the etch bath for selective etching and metal micropatterning. The etch bath was prepared by adding 5.8 g thiourea (99%, Alfa Aesar, Mass., USA, CAS 62-56-6) and 20.8 g ferric nitrate nonahydrate (EMD Chemicals, Inc., Darmstadt, Germany, CAS 7782-61-8) to 2500 mL DI water. The metalized film substrate with the SAM-printed micropattern was placed in the etch bath face down while the etch bath was agitated by bubbling nitrogen for approximately 3 minutes.

The total size of the metal micropatterned substrate was approximately 9 cm×8 cm. The substrate was divided into four quadrants of approximately equal size. In each of the four quadrants there existed a pattern of contiguous hexagonal metal mesh and non-contiguous micropattern features. In each of the four quadrants there existed a graphic in the shape of the 3M logo. The "3M" graphic was approximately 1.1 cm×0.6 cm in size.

Each of the quadrant had a different metal micropattern design, as described as follows:

FIG. 3 is an optical photomicrograph of a metal micropattern having a contiguous hexagonal metal mesh micropattern (2-3 m wide linear metal features forming a hexagonal mesh wherein the hexagons have a diameter of 300 m) that constitutes the conductive bars of a touch sensor and an array of non-contiguous (i.e. dot) micropattern features (3 m×3 m dots on a triangular array with spacing of 10.2 m). This array of non-contiguous dots was present only in the "3M" graphic of Quad 1; whereas the contrasting portion adjacent (e.g. surrounding in Quad 1) the graphic only had the contiguous hexagonal metal mesh micropattern and lacked the non-contiguous (i.e. dot) micropattern features. The dot size and spacing resulted in the 3M graphic having a total metal micropattern density of 11-12%; whereas the contrasting hexagonal metal mesh micropattern outside of the graphic had a total metal micropattern density of 1.3-2%. The metal micropattern contrast ratio for this graphic was approximately 7. The difference in shadowed area fraction (i.e., difference in total metal micropattern density) within and outside this logo was approximately 10% (11.3-12% minus 1.3-2%).

FIGS. 4 and 6 are photomicrographs of metal micropattern having a contiguous hexagonal metal mesh micropattern (2-3 m wide linear metal features forming a hexagonal mesh wherein the hexagons have a diameter of 300 m) that constitutes the conductive bars of a touch sensor and an array of (i.e. 2-3 m wide) linear micropattern features. This array of linear micropattern features was present only in the "3M" graphic of Quads 2 and 4; whereas the contrasting portion adjacent (e.g. surrounding) the graphic only had the contiguous hexagonal metal mesh micropattern and lacked the non-contiguous (i.e. linear) micropattern features. For Quads 2 and 4, the additional linear diffractive micropattern resulted in the 3M graphic having a total metal micropattern density of 2.6-4%; whereas the contrasting hexagonal metal mesh micropattern outside of the graphic had a total metal micropattern density of 1.3-2%. The metal micropattern contrast ratio for this graphic is approximately 2. The difference in shadowed area fraction within and outside this logo was approximately 1.3-2% (2.6-4% minus 1.3-2%).

FIG. 5 is a photomicrograph of a metal micropattern having a contiguous hexagonal metal mesh micropattern (2-3 m wide linear metal features forming a hexagonal mesh wherein the hexagons have a diameter of 300 m) that constitutes the conductive bars of a touch sensor and an array of non-contiguous (i.e. 2-3 m wide) linear micropattern features. The array of non-contiguous linear micropattern feature have a single orientation in the "3M" graphic of FIG. 5; whereas the contrasting portion adjacent (e.g. surrounding) the graphic also had an array of non-contiguous linear micropattern feature at a different (e.g. orthogonal orientation relative to the non-contiguous micropattern features of the graphic. The photomicrograph of FIG. 5 shows the orientations of the additional line elements within and outside the "3M' graphic. The non-contiguous linear micropattern features had a length of 28.3 m; a width of 2-3 m, and are spaced according to the following repeat distances: 1st axis pitch 43.3 m; 2nd axis pitch 42.9 m.

The total metal micropattern density was approximately 4.35 to 6.57% for the metal micropattern area of the graphic and it is the same for the contrasting metal micropattern outside the "3M" graphic. The metal micropattern contrast ratio for this graphic was approximately 1. The difference in shadowed area fraction within and outside this logo was approximately 0% (4.35-6.57% minus 4.35-6.57%).

To evaluate the appearance of the metal micro patterned substrate, the substrate was held against a computer monitor (NEC MultiSync LCD 1760NX) with a brightness setting at 100% and the room lights (i.e. ambient light) on. The monitor was situated at several different viewing angles ranging from approximately normal (i.e. 90 degrees) to 45 degrees to the viewer, and the viewer's eyes were positioned at several viewing distances, ranging from approximately 30 cm-50 cm from the monitor front surface. For viewing the patterned substrate in transmission a white background (i.e. the Google™ homepage) was used, and for viewing in reflection the monitor was turned off such that only the ambient room lights were illuminating the sample. The position of the sample on the monitor was unchanged when switching between transmission viewing and reflection viewing.

The appearance of the 3M graphic was as described in the following table.

| Quadrant | Appearance of 3M graphic when viewed in Transmission | Appearance of 3M graphic when viewed in Reflection |
|---|---|---|
| 1 | Visible as a gray "3M" | "3M" is very visible with bright, angle-dependent color, at most viewing angles |
| 2 | Very slightly visible as a light gray "3M" | "3M" appears slightly bright against a dark background for some viewing angles and muted at other viewing angles |
| 3 | No visible "3M" | "3M" appears i) bright against darker background for some viewing angles; ii) dark against brighter background for some viewing angles; and iii) muted at other viewing angles |
| 4 | Very slightly visible as a light gray "3M" | "3M" appears slightly bright against a dark background for some viewing angles and muted at other viewing angles |

What is claimed is:

1. A substrate comprising a metal micropattern having at least one graphic defined by a contrasting area adjacent the graphic wherein the graphic and the contrasting area comprise non-contiguous micropattern features that differ in density, dimension, shape, orientation, or a combination thereof, and wherein the total metal micropattern density of the graphic is no greater than 10%.

2. The substrate of claim 1 wherein the non-contiguous micropattern features comprise an arrangement of dots, lines, filled shapes, or a combination thereof.

3. The substrate of claim 2 wherein the lines form unfilled shapes.

4. The substrate of claim 2 wherein the graphic comprises non-contiguous micropattern features and the contrasting area is free of non-contiguous micropattern features.

5. The substrate of claim 2 wherein the contrasting area comprises non-contiguous micropattern features and the graphic is free of non-contiguous micropattern features.

6. The substrate of claim 1 wherein the graphic is selected from a logo, trademark, picture, text, indicia, or insignia.

7. The substrate of claim 1 wherein the graphic has at least two dimensions of at least 0.5 mm.

8. The substrate of claim 1 wherein the micropattern features are linear micropattern features or filled shapes having a width of less than 10 microns.

9. The substrate of claim 8 wherein the micropattern features have a width of less than 5 microns.

10. The substrate of claim 1 wherein the graphic and contrasting area have a total metal micropattern density that differs by no greater than about 5%.

11. The substrate of claim 10 wherein the graphic and contrasting area have a total metal micropattern density that differs by no greater than about 1%.

12. The substrate of claim 1 wherein the substrate is a transparent substrate.

13. A substrate comprising a metal micropattern having at least one graphic defined by a contrasting area adjacent the graphic wherein the graphic comprises micropattern features having a different orientation than the contrasting area, and wherein the total metal micropattern density of the graphic is no greater than 10%.

14. The substrate of claim 13 wherein the micropattern features of the graphic are linear micropattern features orientated at angles ranging from 30 degrees to 90 degrees relative to linear micropattern features of the contrasting area.

15. The substrate of claim 13 wherein the micropattern features comprise linear micropattern features that form a metal mesh cell design.

16. The substrate of claim 15 wherein the linear micropattern features are contiguous with the metal mesh.

17. The substrate of claim 16 wherein the linear micropattern features form a metal mesh cell design and the metal mesh cell design of the graphic has a different cell geometry than the contrasting area.

18. A substrate comprising a metal micropattern having at least one graphic defined by a contrasting area adjacent the graphic wherein the graphic, the contrasting area, or a combination thereof comprise parallel linear micropattern features, and wherein the total metal micropattern density of the graphic is no greater than 10%.

19. The substrate of claim 18 wherein the linear micropattern features form a metal mesh cell design and the parallel linear micropattern features are parallel to the metal mesh design.

20. A display comprising a metal micropatterned transparent substrate wherein the metal micropattern comprises at least one graphic that is visible when the display is viewed with reflected light and the graphic is substantially less visible or invisible when viewed with backlighting transmitted through the metal micropatterned substrate, and wherein the total metal micropattern density of the graphic is no greater than 10%.

21. The display of claim 20 wherein the graphic is defined by a contrasting area adjacent the graphic and the graphic and contrasting area have a total metal micropattern density that differs by no greater than about 5%.

22. The display of claim 21 wherein the graphic and contrasting area have a total metal micropattern density that differs by no greater than about 1%.

23. The display of claim 20 wherein the graphic occupies up to about 10% of the total metal micropatterned area of the substrate.

24. The display of claim 20 wherein the metal micropatterned substrate has an average transmission of at least 80%.

* * * * *